(12) United States Patent
Endo et al.

(10) Patent No.: US 11,561,266 B2
(45) Date of Patent: Jan. 24, 2023

(54) MAGNETIC SENSOR

(71) Applicant: SHOWA DENKO K.K., Tokyo (JP)

(72) Inventors: Daizo Endo, Ichihara (JP); Akira Sakawaki, Ichihara (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 17/465,236

(22) Filed: Sep. 2, 2021

(65) Prior Publication Data
US 2022/0099760 A1 Mar. 31, 2022

(30) Foreign Application Priority Data

Sep. 25, 2020 (JP) .............................. JP2020-161148

(51) Int. Cl.
*G01R 33/00* (2006.01)
*H01F 10/13* (2006.01)

(52) U.S. Cl.
CPC ...... *G01R 33/0011* (2013.01); *G01R 33/0052* (2013.01); *H01F 10/131* (2013.01)

(58) Field of Classification Search
CPC ............ G01R 33/0011; G01R 33/0052; G01R 33/038; G01R 33/063; H01F 10/131
USPC ......................................................... 324/244
See application file for complete search history.

(56) References Cited

U.S. PATENT DOCUMENTS

| 10,416,000 B2* | 9/2019 | Ohta ...................... G01D 5/165 |
| 2008/0055788 A1* | 3/2008 | Nagai ..................... G11B 5/112 360/323 |
| 2011/0025320 A1* | 2/2011 | Ohta ....................... H01L 27/22 324/252 |
| 2011/0068786 A1* | 3/2011 | Ohta .................. G01R 33/0052 324/252 |
| 2015/0145504 A1* | 5/2015 | Bai ....................... G01R 33/093 324/207.13 |
| 2015/0268105 A1* | 9/2015 | Fuji ........................... G01L 9/16 73/779 |
| 2018/0172781 A1* | 6/2018 | Ohta .................... G01R 33/093 |
| 2022/0018911 A1 | 1/2022 | Shino et al. |

FOREIGN PATENT DOCUMENTS

| JP | 2002-176210 A | 6/2002 | |
| JP | 2008-249406 A | 10/2008 | |
| JP | 2020106401 A * | 7/2020 | ........... G01R 33/063 |
| WO | 2020/137119 A1 | 7/2020 | |

OTHER PUBLICATIONS

English translation of JP 2020106401A (Year: 2020).*

(Continued)

*Primary Examiner* — Christopher P McAndrew
(74) *Attorney, Agent, or Firm* — Sughrue Mion, PLLC

(57) ABSTRACT

Reduction of the S/N in an output from a magnetic sensor using the magnetic impedance effect is suppressed. A magnetic sensor 1 is provided with a sensitive element 31 including: plural soft magnetic material layers 105; and a nonmagnetic amorphous metal layer 106 provided between the plural soft magnetic material layers 105, wherein the soft magnetic material layers 105 facing each other with the nonmagnetic amorphous metal layer 106 interposed therebetween are antiferromagnetically coupled to sense a magnetic field by a magnetic impedance effect.

7 Claims, 9 Drawing Sheets

(56) References Cited

OTHER PUBLICATIONS

Kiyoshi Itoh et al., "Microstructure and magnetic property of electrodeposited Ni—P alloy film", Tokyo Metropolitan Industrial Technology Research Institute Research Report, 2001, No. 4, pp. 1-4 (5 pages total).
Extended European Search Reported dated Feb. 2, 2022 in European Application No. 21191508.7.

* cited by examiner

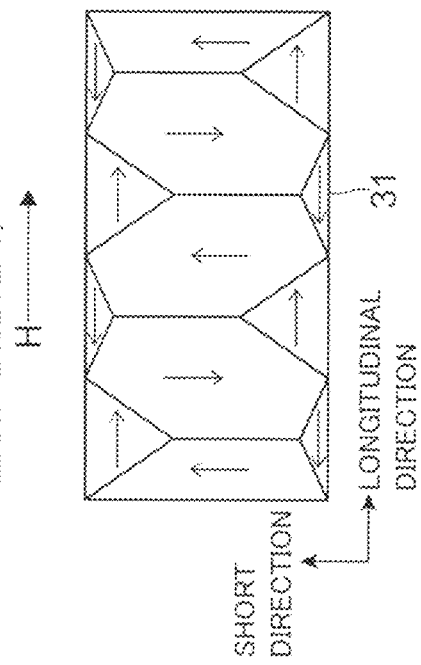
FIG.4A INITIAL MAGNETIC PERMEABILITY RANGE (CLOSURE MAGNETIC DOMAIN)
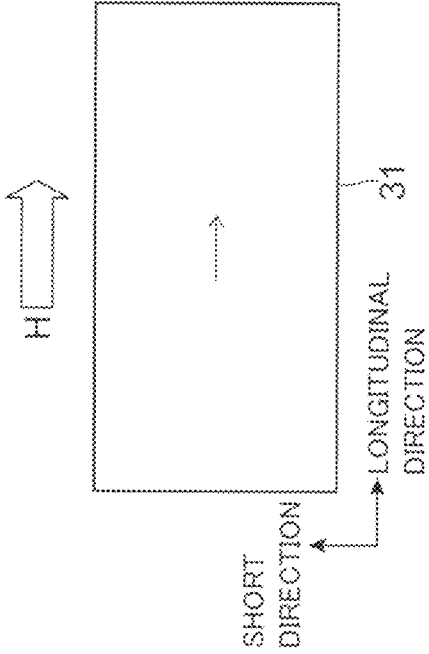
FIG.4B IRREVERSIBLE MAGNETIC DOMAIN WALL DISPLACEMENT RANGE (MAGNETIC DOMAIN WALL DISPLACEMENT)
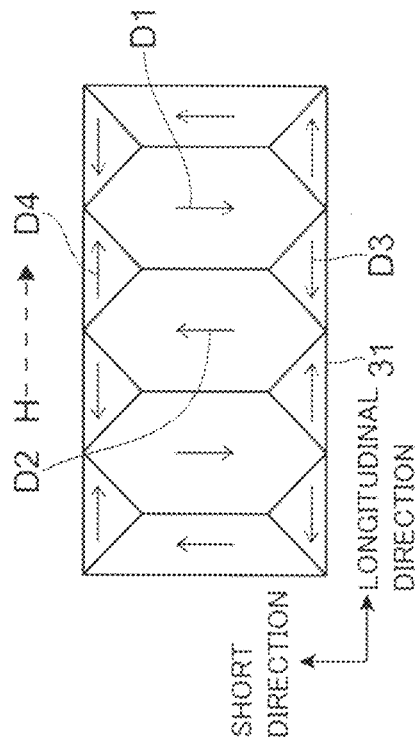
FIG.4C ROTATIONAL MAGNETIZATION RANGE (MAGNETIZATION ROTATION)
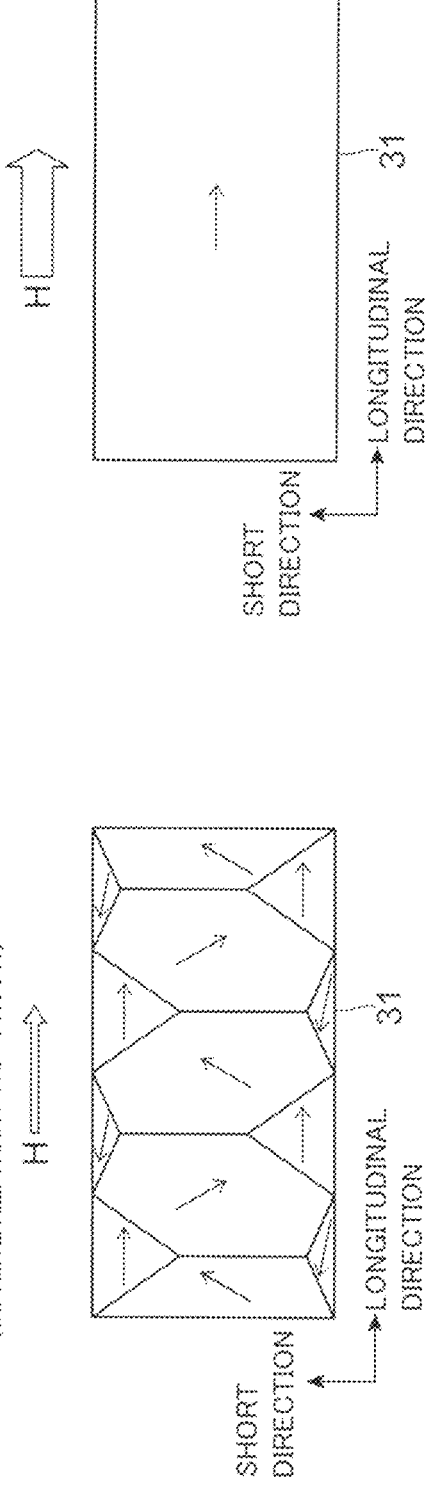
FIG.4D SATURATION (SINGLE MAGNETIC DOMAIN)

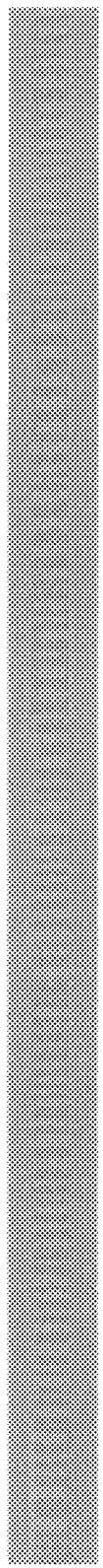
FIG.6A CrTi = 0 nm
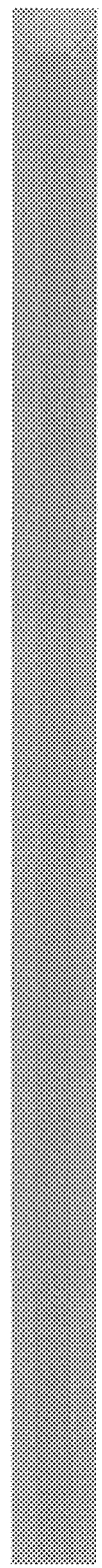
FIG.6B CrTi = 15 nm
FIG.6C CrTi = 30 nm
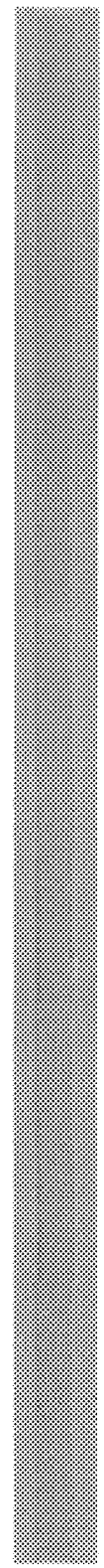
FIG.6D CrTi = 50 nm

MAGNETIC SENSOR

CROSS REFERENCE TO RELATED APPLICATIONS

This application is based on and claims priority under 35 USC § 119 to Japanese Patent Application No. 2020-161148 filed Sep. 25, 2020, the disclosure is incorporated herein by reference in its entirety.

BACKGROUND

Technical Field

The present invention relates to a magnetic sensor.

Related Art

As a related art described in a gazette, there is a magnetic impedance effect element including: a thin-film magnet composed of a hard magnetic material film formed on a nonmagnetic substrate; an insulating layer covering the upside of the thin-film magnet; and a magneto-sensitive part composed of one or plural rectangular soft magnetic material films formed on the insulating layer and imparted with uniaxial anisotropy (refer to Japanese Patent Application Laid-Open Publication No. 2008-249406).

In a magnetic sensor using a sensitive element including a soft magnetic material layer as the magnetic impedance effect element, depending on the structure of the sensitive element, an S/N, which is the ratio of a signal to noise in an output from the magnetic sensor was reduced in some cases.

An object of the present invention is to suppress reduction of the S/N in the output from the magnetic sensor using the magnetic impedance effect.

SUMMARY

A magnetic sensor to which the present invention is applied includes: a sensitive element provided with: plural soft magnetic material layers; and a nonmagnetic amorphous metal layer provided between the plural soft magnetic material layers, wherein the soft magnetic material layers facing each other with the nonmagnetic amorphous metal layer interposed therebetween are antiferromagnetically coupled to allow the sensitive element to sense a magnetic field by a magnetic impedance effect.

In such a magnetic sensor, the sensitive element may further include a conductor layer having conductivity higher than that of the soft magnetic material layer, the conductor layer being provided between a set of the plural soft magnetic material layers facing each other with the nonmagnetic amorphous metal layer interposed therebetween and another set of the plural soft magnetic material layers facing each other with the nonmagnetic amorphous metal layer interposed therebetween.

Then, the nonmagnetic amorphous metal layer may be composed of amorphous metal containing Ti.

Here, the nonmagnetic amorphous metal layer may be composed of one of CrTi and AlTi.

Further, when the nonmagnetic amorphous metal layer is composed of CrTi, a thickness thereof may be 15 nm or more and 50 nm or less.

In such a magnetic sensor, in the sensitive element, when the soft magnetic material layer is viewed from a thickness direction thereof, no closure magnetic domain may be formed.

Moreover, in such a magnetic sensor, there may be further provided a nonmagnetic substrate, and a thin film magnet provided between the substrate and the sensitive element, the thin film magnet being configured with a hard magnetic material and having magnetic anisotropy in an in-plane direction, wherein the sensitive element may have a longitudinal direction and a short direction, the longitudinal direction facing a direction of a magnetic field generated by the thin film magnet.

Further, in such a magnetic sensor, there may be provided a pair of yokes, each being laminated on the thin film magnet to face an end portion of the sensitive element in the longitudinal direction thereof, and guiding a magnetic flux generated from the thin film magnet to pass through the sensitive element in the longitudinal direction thereof, wherein the yoke includes the plural soft magnetic material layers and a nonmagnetic amorphous metal layer laminated between the soft magnetic material layers.

According to the present invention, it is possible to suppress reduction of the S/N in the output from the magnetic sensor using the magnetic impedance effect.

BRIEF DESCRIPTION OF THE DRAWINGS

An exemplary embodiment of the present invention will be described in detail based on the following figures, wherein:

FIGS. 4A to 4D illustrate a relation between strength of a magnetic field to be applied to the sensitive element and changes of a magnetic domain in the sensitive element in a conventional magnetic sensor;

FIGS. 6A to 6D are photographs obtained by shooting the states of the magnetic domain of the sensitive element to which the exemplary embodiment including the structures shown in FIGS. 2A and 2B is applied;

DETAILED DESCRIPTION

Hereinafter, an exemplary embodiment according to the present invention (the exemplary embodiment) will be described with reference to attached drawings.

Figure 1A:
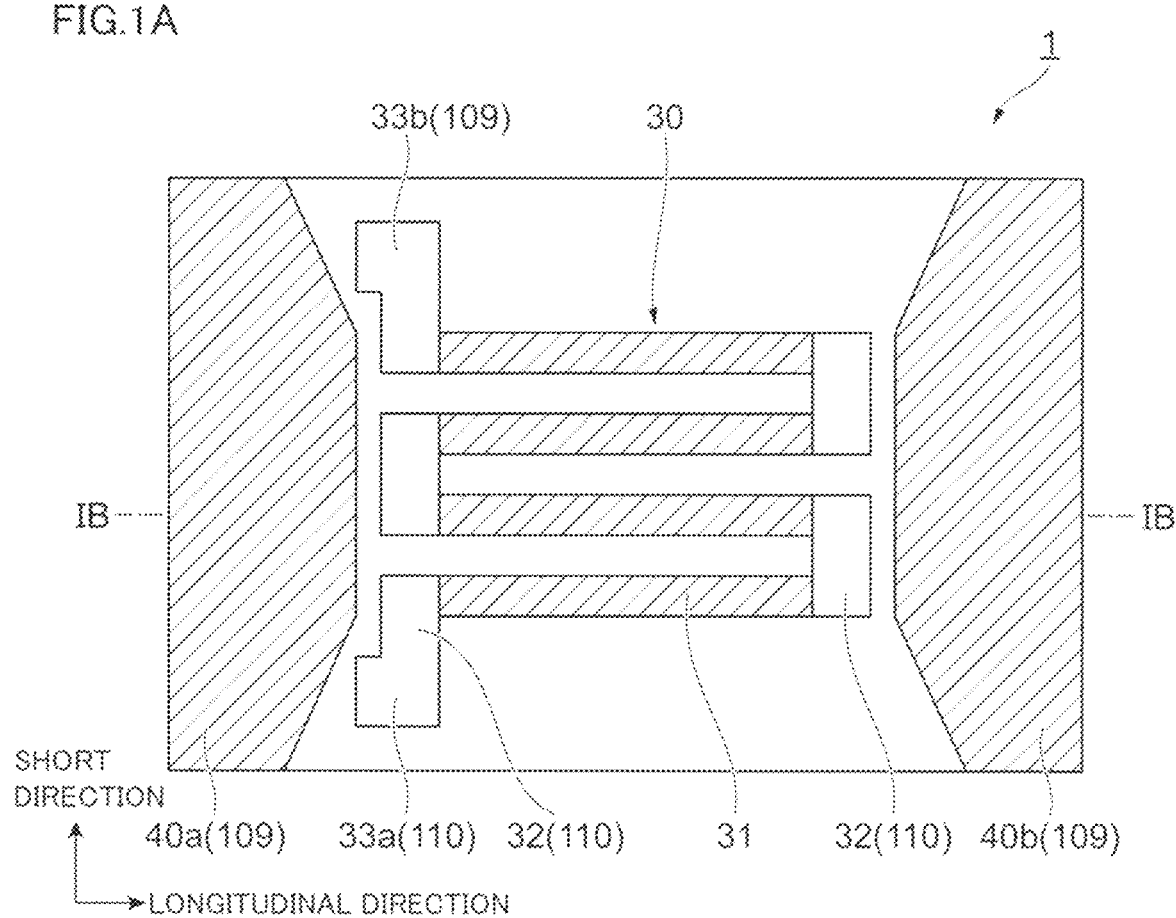
FIGS. 1A and 1B illustrate an example of a magnetic sensor to which the exemplary embodiment is applied.
Figure 1B:
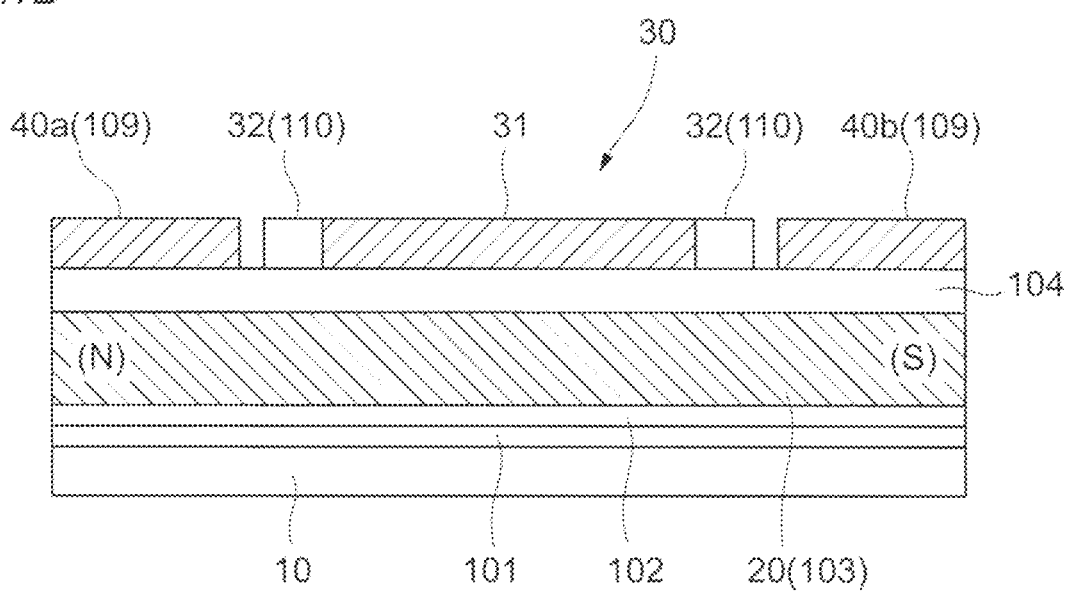

FIGS. 1A and 1B illustrate an example of a magnetic sensor 1 to which the exemplary embodiment is applied. FIG. 1A is a plan view of the magnetic sensor 1 and FIG. 1B is a cross-sectional view along the IB-IB line in FIG. 1A.

As shown in FIG. 1B, the magnetic sensor 1 to which the exemplary embodiment is applied includes: a thin film magnet 20 configured with a hard magnetic material (a hard magnetic material layer 103) provided on a nonmagnetic substrate 10; and a sensitive part 30 provided to face the thin film magnet 20 to sense a magnetic field.

The cross-sectional structure of the magnetic sensor 1 will be described in detail later.

Here, the hard magnetic material has a large, so-called coercive force, the hard magnetic material being once magnetized by an external magnetic field, even upon removal of the external magnetic field, maintaining the magnetized state. On the other hand, the soft magnetic material has a small, so-called coercive force, the soft magnetic material being easily magnetized by an external magnetic field, but, upon removal of the external magnetic field, quickly returning to a state with no magnetization or a little magnetization.

Note that, in the present specification, an element constituting the magnetic sensor 1 (the thin film magnet 20 or the like) is indicated by a two-digit number, and a layer processed into an element (the hard magnetic material layer 103 or the like) is indicated by a number of one hundreds. Then, for an element, a layer processed into the element is written in parentheses in some cases. For example, the case of the thin film magnet 20 is written as thin film magnet 20 (hard magnetic material layer 103). In the figure, the case is written as 20 (103). The same is true in other cases.

Description will be given of a planar structure of the magnetic sensor 1 by FIG. 1A. The magnetic sensor 1 has a quadrangular planar shape as an example. Here, the sensitive part 30 and yokes 40 formed at the uppermost portion of the magnetic sensor 1 will be described.

The sensitive part 30 includes: plural sensitive elements 31; connection parts 32 windingly performing serial connection of the adjacent sensitive elements 31; and terminal parts 33a and 33b to which electric wires for supplying the electrical current are connected. In the sensitive part 30 of the magnetic sensor 1 shown in FIG. 1A, four sensitive elements 31 are arranged so that the longitudinal directions thereof are in parallel with one another. The sensitive element 31 is the magnetic impedance effect element sensitive to the magnetic field by the magnetic impedance effect. The sensitive part 31 has, for example, the length in the longitudinal direction of 1 mm to 2 mm, and the width in the short direction of 50 µm to 150 µm. In addition, the interval between the adjacent sensitive elements 31 is 50 µm to 150 µm.

The connection part 32 is provided between end portions of the adjacent sensitive elements 31 and windingly performs serial connection of the adjacent sensitive elements 31. In the magnetic sensor 1 shown in FIG. 1A, four sensitive elements 31 are disposed in parallel, and therefore there are three connection parts 32. The number of connection parts 32 differs depending on the number of sensitive elements 31. For example, if there are three sensitive elements 31, there are two connection parts 32. Moreover, if there is one sensitive element 31, no connection part 32 is provided. Note that the width of the connection part 32 may be set in accordance with the magnitude of the pulse voltage to be applied to the sensitive part 30. For example, the width of the connection part 32 may be the same as that of the sensitive element 31.

The terminal parts 33a and 33b are provided to the (two) respective end portions of the sensitive elements 31, the end portions not being connected to the connection parts 32. When the terminal parts 33a and 33b are not distinguished, the terminal parts are referred to as a terminal part 33. The terminal part 33 may have a size capable of connecting the electric wire. Note that, in the sensitive part 30 of the exemplary embodiment, since there are four sensitive elements 31, the two terminal parts 33 are provided on the left side in FIG. 1A. In the case where the number of sensitive elements 31 is an odd number, two terminal parts 33 may be divided into right and left.

Further, the magnetic sensor 1 includes yokes 40 each of which is provided to face the end portions of the sensitive elements 31 in the longitudinal direction thereof. Here, there are provided two yokes 40a and 40b, each of which is provided to face each of both end portions of the sensitive elements 31 in the longitudinal direction thereof. Note that, in the case where the yokes 40a and 40b are not distinguished, the yokes are referred to as a yoke 40. The yoke 40 guides lines of magnetic force to the end portion of the sensitive element 31 in the longitudinal direction thereof. Therefore, the yoke 40 is constituted by a soft magnetic material layer 109 through which the lines of magnetic force are likely to pass.

Note that, in the case where the lines of magnetic force sufficiently pass in the longitudinal direction of the sensitive element 31, it is unnecessary to provide the yokes 40.

The size of the magnetic sensor 1 is several millimeters square in the planar shape. Note that the size of the magnetic sensor 1 may be other values.

Next, with reference to FIG. 1B, the cross-sectional structure of the magnetic sensor 1 will be described. The magnetic sensor 1 is configured by providing an adhesive layer 101, a control layer 102, the hard magnetic material layer 103 constituting the thin film magnet 20, and a dielectric layer 104 in this order on a nonmagnetic substrate 10, the dielectric layer 104 being provided with the sensitive part 30 and yokes 40 thereon.

The substrate 10 is composed of a non-magnetic material; for example, an oxide substrate, such as glass or sapphire, a semiconductor substrate, such as silicon, or a metal substrate, such as aluminum, stainless steel, or a nickel-phosphorus-plated metal, can be provided.

The adhesive layer 101 is a layer for improving adhesiveness of the control layer 102 to the substrate 10. As the adhesive layer 101, it is preferable to use an alloy containing Cr or Ni. Examples of the alloy containing Cr or Ni include CrTi, CrTa and NiTa. The thickness of the adhesive layer 101 is, for example, 5 nm 50 nm. Note that, if there is no problem in adhesiveness of the control layer 102 to the substrate 10, it is unnecessary to provide the adhesive layer 101. Note that, in the present specification, composition ratios of alloys containing Cr or Ni are not shown. Hereinafter, the configuration will be the same except for the cases in which the composition ratio is explicitly shown.

The control layer 102 controls the magnetic anisotropy of the thin film magnet 20 configured with the hard magnetic material layer 103 to be likely to express in the in-plane direction of the film. As the control layer 102, it is preferable to use Cr, Mo or W, or an alloy containing thereof (hereinafter, referred to as an alloy containing Cr or the like to constitute the control layer 102). Examples of the alloy containing Cr or the like to constitute the control layer 102 include CrTi, CrMo, CrV and CrW. The thickness of the control layer 102 is, for example, 10 nm 300 nm.

It is preferable that the hard magnetic material layer 103 constituting the thin film magnet 20 uses an alloy that contains Co as a main component and also contains at least one of Cr and Pt (hereinafter, referred to as a Co alloy constituting the thin film magnet 20). Examples of the Co alloy constituting the thin film magnet 20 include CoCrPt, CoCrTa, CoNiCr and CoCrPtB. Note that Fe may be contained. The thickness of the hard magnetic material layer 103 is, for example, 1 µm to 3 µm.

The alloy containing Cr or the like to constitute the control layer 102 has a bcc (body-centered cubic) structure. Consequently, the hard magnetic material constituting the thin film magnet 20 (the hard magnetic material layer 103) preferably has an hcp (hexagonal close-packed) structure easily causing crystal growth on the control layer 102 composed of the alloy containing Cr or the like having the bcc structure. When crystal growth of the hard magnetic material layer 103 having the hcp structure is caused on the bcc structure, the c-axis of the hcp structure is likely to be oriented in a plane. Therefore, the thin film magnet 20 configured with the hard magnetic material layer 103 is likely to have the magnetic anisotropy in the in-plane direction. Note that the hard magnetic material layer 103 is polycrystalline composed of a set of crystals with different crystal orientations, and each crystal has the magnetic anisotropy in the in-plane direction. The magnetic anisotropy derives from crystal magnetic anisotropy.

Note that, to promote the crystal growth of the alloy containing Cr or the like to constitute the control layer 102 and the Co alloy constituting the thin film magnet 20, the substrate 10 may be heated to 100° C. to 600° C. By the heating, the crystal growth of the alloy containing Cr or the like constituting the control layer 102 is likely to be caused, and thereby crystalline orientation is likely to be provided so that the hard magnetic material layer 103 having the hcp structure includes an axis of easy magnetization in a plane. In other words, the magnetic anisotropy is likely to be imparted in a plane of the hard magnetic material layer 103.

The dielectric layer 104 is configured with a nonmagnetic dielectric material and electrically insulates the thin film magnet 20 and the sensitive part 30. Examples of the dielectric material constituting the dielectric layer 104 include oxide, such as $SiO_2$, $Al_2O_3$, or $TiO_2$, or nitride, such as $Si_3N_4$ or AlN. In addition, the thickness of the dielectric layer 104 is, for example, 0.1 μm to 30 μm.

Next, the configuration of each of the sensitive elements 31 of the sensitive part 30 will be described.

Figure 2A:
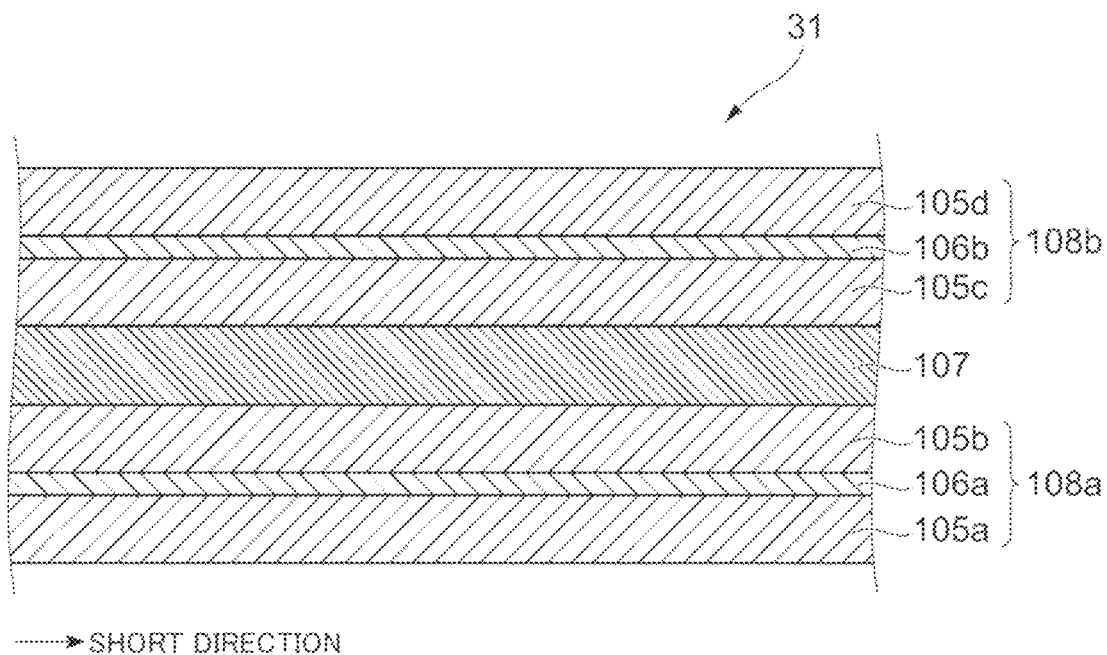
FIGS. 2A and 2B illustrate configurations of each sensitive element of a sensitive part to which the exemplary embodiment is applied.
Figure 2B:
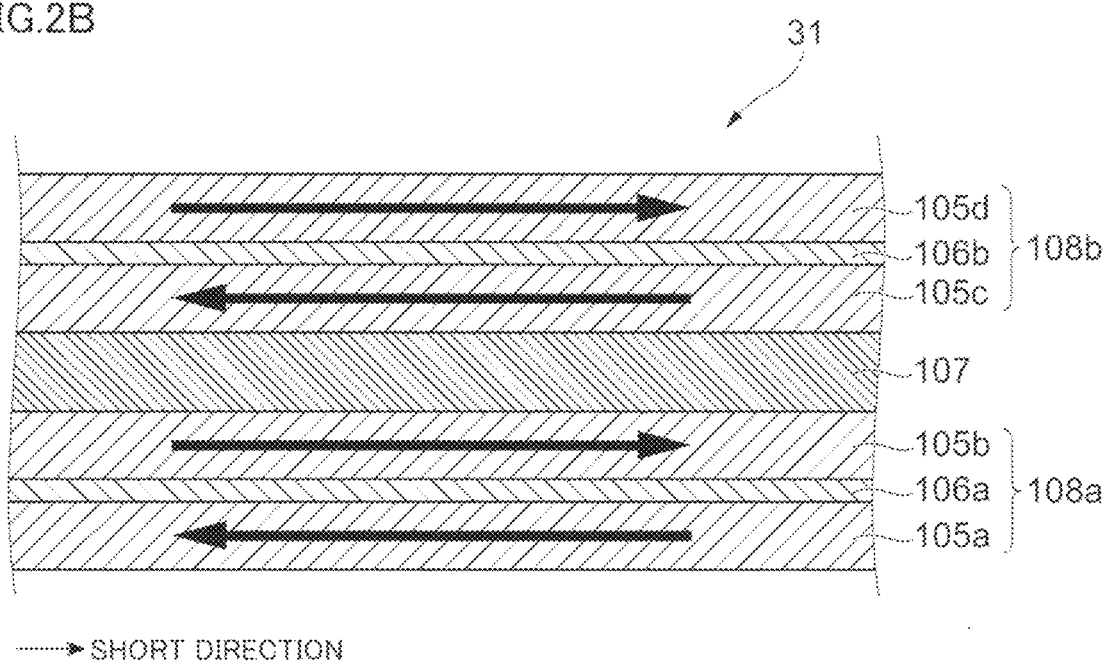

FIGS. 2A and 2B illustrate the configuration of each of the sensitive elements 31 of the sensitive part 30 to which the exemplary embodiment is applied. FIG. 2A is an enlarged cross-sectional view of the sensitive element 31 in the magnetic sensor 1 shown in FIG. 1B, and FIG. 2B shows magnetization directions in the sensitive element 31. Note that an arrow in FIG. 2B indicates a magnetization direction. FIGS. 2A and 2B are cross-sectional views of the sensitive element 31 in the short direction.

As shown in FIG. 2A, each sensitive element 31 of the sensitive part 30 is configured by laminating, from the dielectric layer 104 (refer to FIG. 1B) side, a soft magnetic material layer 105a, a nonmagnetic amorphous metal layer 106a, a soft magnetic material layer 105b, a conductor layer 107, a soft magnetic material layer 105c, a nonmagnetic amorphous metal layer 106b, and a soft magnetic material layer 105d in this order. Note that, in the case where the soft magnetic material layers 105a to 105d and the nonmagnetic amorphous metal layers 106a to 106b are not distinguished, these layers are denoted as a soft magnetic material layer 105 and a nonmagnetic amorphous metal layer 106, respectively. In addition, the soft magnetic material layer 105a, the nonmagnetic amorphous metal layer 106a, and the soft magnetic material layer 105b are denoted as a laminated body 108a, and the soft magnetic material layer 105c, the nonmagnetic amorphous metal layer 106b, and the soft magnetic material layer 105d are denoted as a laminated body 108b. Note that, in the case where the laminated bodies 108a and 108b are not distinguished, the laminated bodies are denoted to as a laminated body 108.

In other words, as shown in FIGS. 2A and 2B, in the sensitive element 31 to which the exemplary embodiment is applied, plural (here, two) laminated bodies 108 (in FIGS. 2A and 2B, denoted as the laminated bodies 108a and 108b) are laminated (provided) with the conductor layer 107 interposed therebetween. In the laminated body 108, two soft magnetic material layers 105 are laminated (provided) to face each other with the nonmagnetic amorphous metal layer 106 interposed therebetween. Note that it is unnecessary to provide the two laminated bodies 108; three or more laminated bodies 108 may be laminated via the conductor layers 107.

Here, the conductor layer 107 is provided to lower the resistance of the sensitive element 31. For example, the conductor layer 107 has conductivity higher than that of the soft magnetic material layer 105. Note that the high conductivity means, for example, the low sheet resistance.

As shown in FIG. 2B, in the sensitive element 31, the soft magnetic material layers 105 facing each other with the nonmagnetic amorphous metal layer 106 interposed therebetween are antiferromagnetically coupled (AFC) by the action of the nonmagnetic amorphous metal layer 106. More specifically, in the sensitive element 31, the soft magnetic material layers 105a and 105b facing each other with the nonmagnetic amorphous metal layer 106a interposed therebetween are antiferromagnetically coupled, and the soft magnetic material layers 105c and 105d facing each other with the nonmagnetic amorphous metal layer 106b interposed therebetween are antiferromagnetically coupled. Note that the soft magnetic material layers 105b and 105c facing each other with the conductor layer 107 interposed therebetween are antiferromagnetically coupled.

As the soft magnetic material layer 105, it is preferable to use an amorphous alloy, which is an alloy containing Co as a main component doped with a high melting point metal, such as Nb, Ta or W (hereinafter, referred to as a Co alloy constituting the soft magnetic material layer 105). Examples of the Co alloy constituting the soft magnetic material layer 105 include CoNbZr, CoFeTa and CoWZr.

In addition, the thickness of each soft magnetic material layer 105, which is shown as the soft magnetic material layer 105a, 105b, 105c, or 105d in FIG. 2A, can be within the range from 10 nm to 2000 nm, preferably within the range from 100 nm to 1000 nm.

As the nonmagnetic amorphous metal layer 106, the nonmagnetic amorphous metal having the action of allowing the soft magnetic material layers 105 facing each other with the nonmagnetic amorphous metal layer 106 interposed therebetween to be antiferromagnetically coupled can be used, and specific examples of such nonmagnetic amorphous metal include CrTi, AlTi, CrB, CrTa, and CoW.

In addition, the thickness of the nonmagnetic amorphous metal layer 106 differs depending on the material composing the nonmagnetic amorphous metal layer 106. As will be described later, in the case of the nonmagnetic amorphous metal layer 106 that is too thin, there is a possibility that the S/N of the sensitive element 31 is decreased; in the case of the nonmagnetic amorphous metal layer 106 that is too thick, there is a possibility that the antiferromagnetic coupling energy of the soft magnetic material layers 105 facing each other with the nonmagnetic amorphous metal layer 106 interposed therebetween is reduced.

Note that the amorphous alloy and amorphous metal refer to those having a structure not including regular atomic arrangement, such as crystals, and being formed by the sputtering method or the like.

The conductor layer 107 may be a layer reducing the resistance of the sensitive element 31, for example, a layer with conductivity higher than that of the soft magnetic material layer 105. As the conductor layer 107, it is preferable to use metal or an alloy that has high conductivity, and more preferable to use metal or an alloy that has high conductivity and is nonmagnetic. Specifically, it is preferable to use metal, such as Ag, Al, or Cu, as the conductor layer 107. The thickness of the conductor layer 107 is, for example, 10 nm to 500 nm. Note that the thickness of the conductor layer 107 can be changed by the kinds of the Co alloy composing the sensitive element 31 to be used as the soft magnetic material layer 105 or the kinds of the conductor to be used as the conductor layer 107 so as to obtain the desired value of the resistance R of the sensitive element 31, the value of the magnetic field sensed by the sensitive element 31, or the like, to be described later.

Use of the conductor layer 107 will be described in detail later.

The sensitive element 31 is provided with uniaxial magnetic anisotropy in a direction crossing the longitudinal direction, for example, a short direction intersecting the longitudinal direction (in other words, the width direction of the sensitive element 31). In short, the short direction is the magnetization direction. Note that the direction intersecting the longitudinal direction may have an angle exceeding 45°.

Returning to FIGS. 1A and 1B, the connection parts 32, the terminal parts 33 and the yokes 40 will be described.

A conductor layer 110 constituting the connection part 32 and the terminal part 33 may be a conductor with excellent conductivity, and, for example, Ag, Cu, Au, or Al can be used; however, the conductor is not particularly limited thereto. Moreover, the connection parts 32 and the terminal parts 33 may be formed integrally with the sensitive element 31. Thus, it is unnecessary to form the connection parts 32 and the terminal parts 33 separately.

The yoke 40 guides the lines of the magnetic force to the end portion of the sensitive element 31 in the longitudinal direction thereof. Therefore, it is preferable that the yoke 40 is constituted by the soft magnetic material layer 109 through which the lines of the magnetic force are likely to pass. As described above, since the sensitive element 31 is configured to include the soft magnetic material layers 105, the yoke 40 may have the same structure as the sensitive element 31. With this, it is unnecessary to form the yokes 40 separately.

In the magnetic sensor 1 of the exemplary embodiment, the adhesive layer 101, the control layer 102, the hard magnetic material layer 103, and the dielectric layer 104 are processed to have a quadrangular planar shape (refer to FIGS. 1A and 1B). Then, of the exposed side surfaces, in the two facing side surfaces, the thin film magnet 20 serves as the north pole ((N) in FIG. 1B) and the south pole ((S) in FIG. 1B). Note that the line connecting the north pole and the south pole of the thin film magnet 20 takes the longitudinal direction of the sensitive element 31 in the sensitive part 30. Here, to take the longitudinal direction means that an angle formed by the line connecting the north pole and the south pole and the longitudinal direction is less than 45°. Note that the smaller the angle formed by the line connecting the north pole and the south pole and the longitudinal direction, the better.

In the magnetic sensor 1, the lines of the magnetic force coming from the north pole of the thin film magnet 20 once go to the outside of the magnetic sensor 1. Then, a part of the lines of the magnetic force passes through the sensitive element 31 via the yoke 40a and goes to the outside again via the yoke 40b. The lines of the magnetic force that have passed through the sensitive element 31 return to the south pole of the thin film magnet 20 together with the lines of magnetic force that have not passed through the sensitive element 31. In other words, the thin film magnet 20 applies the magnetic field (the bias magnetic field Hb to be described later) to the longitudinal direction of the sensitive element 31.

Note that the north pole and the south pole of the thin film magnet 20 are collectively referred to as both magnetic poles, and when the north pole and the south pole are not distinguished, they are referred to as a magnetic pole.

Note that, as shown in FIG. 1A, the yoke 40 (the yokes 40a and 40b) is configured so that the shape thereof as viewed from the front surface side of the substrate 10 is narrowed as approaching the sensitive part 30. This is to concentrate the magnetic field to (to gather the lines of the magnetic force on) the sensitive part 30. In other words, the magnetic field in the sensitive part 30 is strengthened to further improve the sensitivity. Note that the width of the portion of the yoke 40 (the yokes 40a and 40b) facing the sensitive part 30 may not be narrowed.

Here, the interval between the yoke 40 (the yokes 40a and 40b) and the sensitive parts 30 may be, for example, 1 μm to 100 μm.

(Action of Magnetic Sensor 1)

Subsequently, the action of the magnetic sensor 1 will be described.

Figure 3:
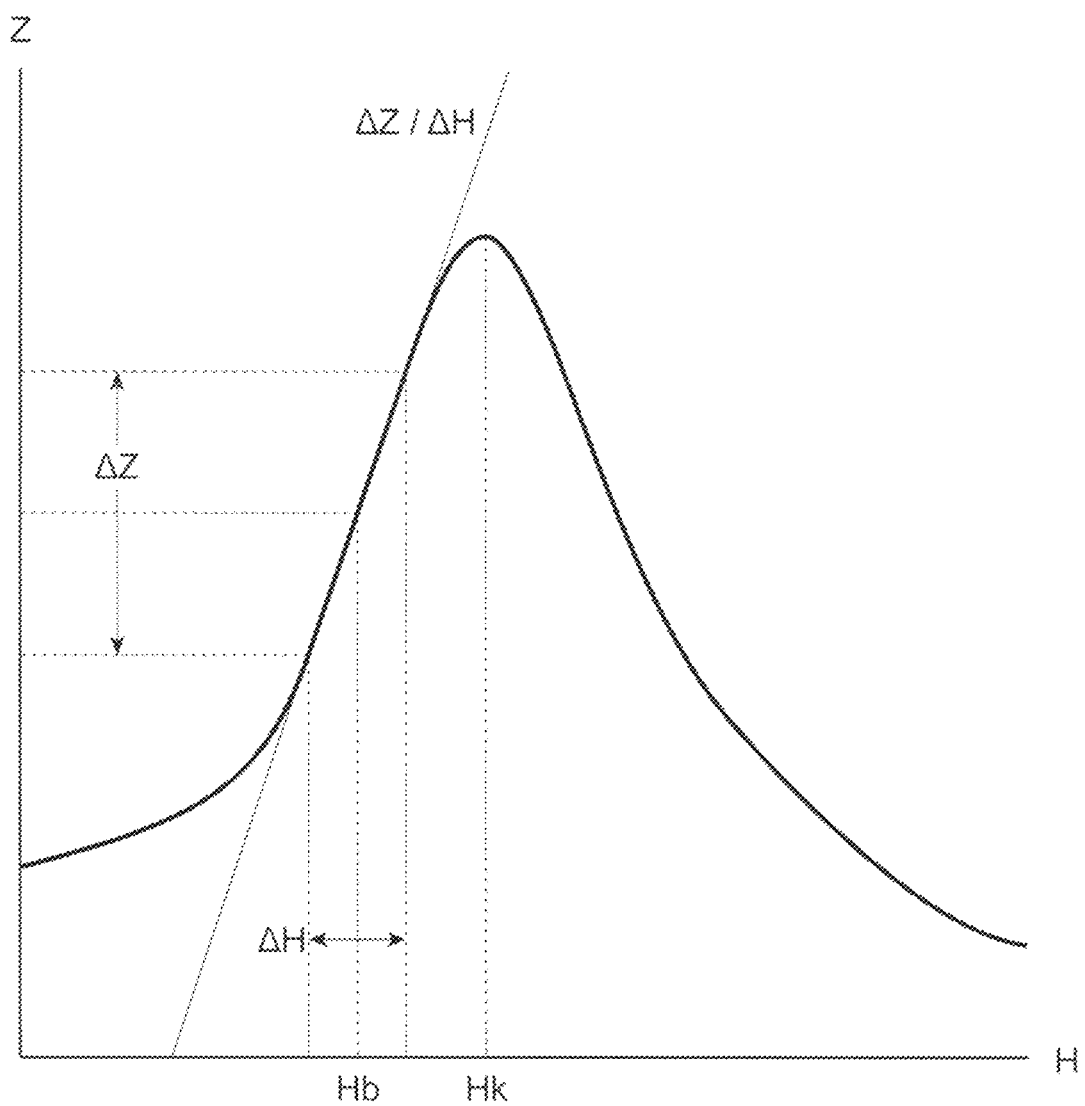
FIG. 3 illustrates a relation between a magnetic field applied in the longitudinal direction of the sensitive element in the sensitive part of the magnetic sensor and an impedance of the sensitive part.

FIG. 3 is a diagram illustrating a relation between the magnetic field H applied in the longitudinal direction of the sensitive element 31 in the sensitive part 30 and the impedance Z of the sensitive part 30 in the magnetic sensor 1. In FIG. 3, the horizontal axis indicates the magnetic field H and the vertical axis indicates the impedance Z. The impedance Z of the sensitive part 30 is measured by supplying (passing) the high-frequency electrical current between two terminal parts 33.

As shown in FIG. 3, the impedance Z of the sensitive part 30 is increased as the magnetic field H applied to the longitudinal direction of the sensitive element 31 is increased. Consequently, within the range in which the magnetic field H to be applied is smaller than the anisotropic magnetic field Hk of the sensitive element 31, by use of a portion where the amount of changes ΔZ in the impedance Z with respect to the amount of changes ΔH in the magnetic field H is steep (ΔZ/ΔH is large), it is possible to extract extremely weak changes in the magnetic field H as the amount of changes ΔZ in the impedance Z. In FIG. 3, the center of the magnetic field H where ΔZ/ΔH is large is shown as the magnetic field Hb. In other words, it is possible to measure the amount of changes (ΔH) in the magnetic field H in the vicinity to the magnetic field Hb (the range indicated by arrows in FIG. 3) with high accuracy. The magnetic field Hb is referred to as a bias magnetic field in some cases. Hereinafter, the magnetic field Hb is referred to as the bias magnetic field Hb.

In the magnetic sensor 1 using a sensitive element 31 including no conductor layer 107 as the magnetic impedance effect element, high-frequency current to be supplied lowers the amount of changes ΔZ of the impedance Z to the amount of changes ΔH of the magnetic field H (ΔZ/ΔH) in some cases. For example, with the current to be supplied having the frequency of less than 100 MHz, the amount of changes ΔZ of the impedance Z (ΔZ/ΔH) is increased; however, with the current to be supplied having the frequency of not less than 100 MHz, the amount of changes ΔZ of the impedance Z (ΔZ/ΔH) is decreased in some cases. In other words, in the magnetic sensor 1 using the sensitive element 31 including no conductor layer 107, high-frequency current to be supplied deteriorates the sensitivity to the changes in the magnetic field H in some cases.

It is assumed that degradation in the sensitivity of the magnetic sensor 1 in the case where the high-frequency current is supplied is due to the influence of floating capacitance generated in the gaps between the sensitive elements 31 arranged in parallel or the gaps between the sensitive elements 31 (the sensitive part 30) and the yokes 40. To additionally describe, it is assumed that the degradation is due to the influence of increase of the capacitive component (the capacitive reactance) in an imaginary part of the impedance Z in the magnetic sensor 1.

Then, in the magnetic sensor 1, increase of the length of the sensitive element 31 or increase of the number of sensitive elements 31 to be arranged in parallel increases the gaps between the sensitive elements 31 or the gaps between the sensitive elements 31 (the sensitive part 30) and the yokes 40; therefore, the floating capacitance is likely to have greater influence. As a result, it is considered that the sensitivity of magnetic sensor 1 is significantly decreased.

In the magnetic sensor 1, the resistance of the sensitive element 31 and the floating capacitance are referred to as R and C, respectively, and it is assumed that the sensitive element 31 is configured with a parallel circuit of the resistance R and the floating capacitance C. Then, a relaxation frequency $f_0$ of the magnetic sensor 1 is high as the resistance R is low or the floating capacitance C is low. In other words, with the lower resistance R or the lower floating capacitance C, the sensitivity of the magnetic sensor 1 supplied with the high-frequency current is improved. Therefore, in the magnetic sensor 1, to which the exemplary embodiment is applied, the sensitive element 31 is provided with the conductor layer 107 to prevent the amount of changes ΔZ of the impedance Z (ΔZ/ΔH) from reducing even in the case where the frequency of the current to be supplied is high.

(Potential Problems in Conventional Magnetic Sensor)

Incidentally, in the conventional magnetic sensor including the sensitive elements 31 as the magnetic impedance effect element, depending on the structure of the sensitive element 31, the S/N, which is the ratio of a signal to noise in the output from the magnetic sensor, is reduced in some cases. For example, in the case where the sensitive element 31 is configured with a single layer of the soft magnetic material, the S/N is reduced in some cases. It is assumed that this is caused by formation of the closure magnetic domain, in which the magnetization direction is annular, in the sensitive element 31 (details will be described later) and displacement of a magnetic domain wall constituting the closure magnetic domain with the changes in the magnetic field H in the vicinity of the bias magnetic field Hb.

Hereinafter, the phenomenon that the S/N of the magnetic sensor is reduced by the closure magnetic domain formed in the sensitive element 31 will be specifically described.

FIGS. 4A to 4D illustrate a relation between strength of the magnetic field H to be applied to the sensitive element 31 and changes in the magnetic domain in the sensitive element 31 in the conventional magnetic sensor. Here, it is assumed that, in the initial state where the magnetic field H is 0, uniaxial magnetic anisotropy has already been imparted in the short direction of the sensitive element 31.

FIG. 4A shows an example of a magnetic domain structure of the sensitive element 31 in a state where the magnetic field H is very weak, close to 0 (referred to as "initial magnetic permeability range," details thereof will be described later). FIG. 4B shows an example of the magnetic domain structure of the sensitive element 31 in a state where the magnetic field H is strengthened than the state shown in FIG. 4A (referred to as "irreversible magnetic domain wall displacement range," details thereof will be described later). FIG. 4C shows an example of the magnetic domain structure of the sensitive element 31 in a state where the magnetic field H is strengthened than the state shown in FIG. 4B (referred to as "rotational magnetization range," details thereof will be described later). FIG. 4D shows an example of the magnetic domain structure of the sensitive element 31 in a state where the magnetic field H is strengthened than the state shown in FIG. 4C (referred to as "saturation," details thereof will be described later).

Figure 5:
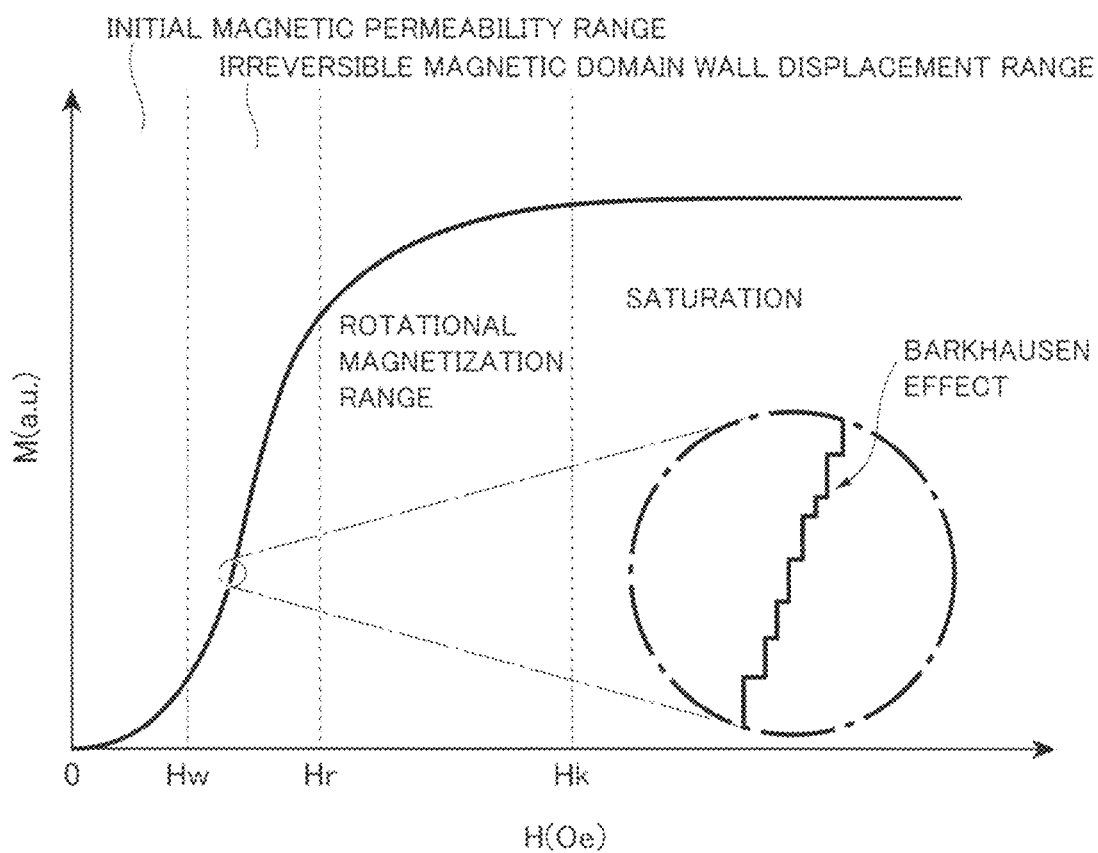
FIG. 5 illustrates a relation between strength of a magnetic field to be applied to the sensitive element and intensity of magnetization in the sensitive element.

FIG. 5 illustrates a relation between strength of the magnetic field H to be applied to the sensitive element 31 and intensity of magnetization M in the sensitive element 31. In FIG. 5, the horizontal axis indicates the magnetic field H (Oe) and the vertical axis indicates the magnetization M (a.u.). Note that FIG. 5 shows relation between the magnetic field H and magnetization M, and the above-described "initial magnetic permeability range," "irreversible magnetic domain wall displacement range," "rotational magnetization range," and "saturation."

In FIG. 5, the range of the magnetic field H, which is applied to the sensitive element 31 from the outside, from 0 to a magnetic domain wall displacing magnetic field Hw (details thereof will be described later), is the "initial magnetic permeability range."

Within the initial magnetic permeability range, in the sensitive element 31, plural magnetic domains with different directions of the magnetization M have been formed. To describe more specifically with reference to FIG. 4A, the sensitive element 31 has a first magnetic domain D1 and a second magnetic domain D2, where the direction of magnetization M is in the direction of the easy axis of magnetization (short direction), and a third magnetic domain D3 and a fourth magnetic domain D4, where the direction of magnetization M is in the direction of the hard axis of magnetization (longitudinal direction). At this time, the directions of the first magnetic domain D1 and the second magnetic domain D2 are opposite each other, and the directions of the third magnetic domain D3 and the fourth magnetic domain D4 are opposite each other. These four magnetic domains are then arranged in a circulating manner in the clockwise direction in the figure, from "first magnetic domain D1" to "third magnetic domain D3" to "second magnetic domain D2" to "fourth magnetic domain D4" to "first magnetic domain D1." As a result, taken as a whole, these four magnetic domains form the closure magnetic domain in which the direction of magnetization M is annular.

Moreover, from a macroscopic point of view, in the sensitive element 31, plural closure magnetic domains are arranged along the longitudinal direction. Then, in each closure magnetic domain, based on relation between the above-described easy axis of magnetization and hard axis of magnetization, each area of the first magnetic domain D1 and the second magnetic domain D2 along the easy axis of magnetization is larger than each area of the third magnetic domain D3 and the fourth magnetic domain D4 along the hard axis of magnetization.

In the initial magnetic permeability range, each magnetic domain that constitutes each closure magnetic domain is kept intact in response to changes in the magnetic field H. In other words, in the case where the magnetic field H is between 0 and the magnetic domain wall displacing magnetic field Hw, even if the magnetic field H is increased, the magnetic domain structure shown in FIG. 4A remains unchanged.

In FIG. 5, the range of the magnetic field H, which is applied to the sensitive element 31 from the outside, from the magnetic domain wall displacing magnetic field Hw to a magnetized rotating magnetic field Hr (details thereof will be described later) is referred to as "irreversible magnetic domain wall displacement range."

If the magnetic field H exceeds the magnetic domain wall displacing magnetic field Hw, which is determined based on the properties (material, structure, dimensions, and the like) of the soft magnetic material layer 105 constituting the sensitive element 31, magnetic domain wall displacement, which means displacement of the position of the magnetic domain wall between the adjacent magnetic domains with the action of the magnetic field H, is caused in each closure magnetic domain. To specifically describe with reference to FIG. 4B, in each closure magnetic domain, the magnetic domain walls between the fourth magnetic domain D4, with the direction of magnetization M same as the direction of the magnetic field H, and the first and second magnetic domains D1 and D2 adjacent to the fourth magnetic domain D4 are displaced to the side increasing the area of the fourth magnetic domain D4. In addition, the magnetic domain walls between the third magnetic domain D3, with the direction of magnetization M opposite to the direction of the magnetic field H, and the first and second magnetic domains D1 and D2 adjacent to the third magnetic domain D3 are displaced to the side decreasing the area of the third magnetic domain D3. As a result, the area of the fourth magnetic domain D4 is increased as compared to the area in the initial magnetic permeability range shown in FIG. 4A, and each area of the first to third magnetic domains D1 to D3 is reduced as compared to the area in the initial magnetic permeability range.

Moreover, the displacement of the magnetic domain walls in the irreversible magnetic domain wall displacement range is discontinuously caused as the magnetic field H increases. As a result, the changes in the magnetization M in the sensitive element 31 as a whole with respect to the magnetic field H are in a stepwise (jagged) manner, not in the linear shape or the curved shape, as shown in FIG. 5 including an enlarged major part. Note that such a relation between the magnetic field H and the magnetization M is called the Barkhausen effect.

In the irreversible magnetic domain wall displacement range, the state where the area ratio of the magnetic domains constituting the respective closure magnetic domains gradually changes in response to the changes in the magnetic field H continues. To describe more specifically, in the case where the magnetic field H is between the magnetic domain wall displacing magnetic field Hw and the magnetized rotating magnetic field Hr, the area of the fourth magnetic domain D4 gradually increases and the areas of the respective first to third magnetic domains D1 to D3 gradually decrease as the magnetic field H increases.

In FIG. 5, the range of the magnetic field H, which is applied from the outside, from the magnetized rotating magnetic field Hr to the anisotropic magnetic field Hk is referred to as "rotational magnetization range."

If the magnetic field H exceeds the magnetized rotating magnetic field Hr, which is determined based on the properties (material, structure, dimensions, and the like) of the soft magnetic material layer 105 constituting the sensitive element 31, in each closure magnetic domain, in the state where the positions of the magnetic domain walls among the adjacent magnetic domains are substantially fixed, magnetized rotation is caused, in the magnetic domain having the direction of the magnetization M different from the direction of the magnetic field H, to allow the direction of the magnetization M to be in the same direction as the magnetic field H. To describe more specifically with reference to FIG. 4C, in each of the first to third magnetic domains D1 to D3 having the direction of the magnetization M different from the direction of the magnetic field H, magnetization rotation occurs, where the direction of the magnetization M is gradually rotated so that the direction of the magnetization M is in the same direction of the magnetic field H. At this time, the fourth magnetic domain D4 remains intact because the direction of the magnetization thereof has already been consistent with the direction of the magnetic field H.

Then, in the rotational magnetization range, the state where the area ratio of the magnetic domains constituting the respective closure magnetic domains is almost unchanged in response to the changes in the magnetic field H, whereas the directions of the magnetization M in the first to third magnetic domains D1 to D3 gradually change continues. In other words, in the case where the magnetic field H is located between the magnetized rotating magnetic field Hr and the anisotropic magnetic field Hk, the direction of the magnetization M in the fourth magnetic domain D4 does not change, but the direction of each magnetization M in other first to third magnetic domains D1 to D3 gradually rotates toward the side that is consistent with the direction of the magnetic field H, as the magnetic field H increases.

However, in the rotational magnetization range, the rotation of direction of each magnetization M in the first to third magnetic domains D1 to D3 occurs continuously. Consequently, in the rotational magnetization range, the changes in the magnetization M in the sensitive element 31 as a whole with respect to the magnetic field H are in a curved shape as shown in FIG. 5. Then, in the rotational magnetization range, the increase in the magnetization M in the sensitive element 31 as a whole with respect to the increase in the magnetic field H is slowed down with the increase in the magnetic field H, and becomes substantially flat in the vicinity of the anisotropic magnetic field Hk where the magnetization M is maximum.

In FIG. 5, the region where the magnetic field H applied from the outside exceeds the anisotropic magnetic field Hk is referred to as "saturation."

If the magnetic field H exceeds the above-described anisotropic magnetic field Hk, the direction of the magnetization M in each closure magnetic domain is aligned with the direction of the magnetic field H. To describe more specifically with reference to FIG. 4D, the directions of the magnetization M in the first to third magnetic domains D1 to D3 are aligned with the direction of the magnetization M in the fourth magnetic domain D4. As a result, the magnetic domain walls that existed among adjacent magnetic domains disappear, and the sensitive element 31 is formed by one magnetic domain (single magnetic domain).

Moreover, in saturation, as the magnetic domain structure has changed from the configuration with plural closure magnetic domains to a configuration with a single magnetic domain, the magnetization M of the entire sensitive element 31 does not change in response to the change in the magnetic field H, thus taking substantially a constant value.

Usually, in the magnetic sensor, the magnitude of the bias magnetic field Hb is set to the irreversible magnetic domain wall displacement range in which the amount of changes ΔM of the magnetization M with respect to the amount of changes ΔH of the magnetic field H is large (that is, the amount of changes ΔZ of the impedance Z with respect to the amount of changes ΔH of the magnetic field H is large). Then, in the irreversible magnetic domain wall displacement range, if the closure magnetic domain is formed in the sensitive element 31, with the changes in the magnetic field H, the Barkhausen effect is generated in which the magnetic domain wall constituting the closure magnetic domain moves in a discontinuous stepwise manner. It is assumed that the discontinuous movement of the magnetic domain wall in the sensitive element 31 becomes noise, and the S/N in the output obtained from the magnetic sensor is decreased.

Consequently, in order to reduce the noise associated with the discontinuous movement of the magnetic domain wall and to suppress the S/N reduction in the output obtained from the magnetic sensor, it is preferable to enlarge the magnetic domain formed in the sensitive element 31 so as not to form the closure magnetic domain in the sensitive element 31.

(Magnetic Domain Structure of Sensitive Element 31 in the Exemplary Embodiment)

In contrast thereto, the sensitive element 31 in the magnetic sensor 1 of the exemplary embodiment is configured so that the two soft magnetic material layers 105 face each with the nonmagnetic amorphous metal layer 106 interposed therebetween. With this, the closure magnetic domain is less likely to be formed in the sensitive element 31. Note that, as shown in FIG. 2A, the sensitive element 31 in the magnetic sensor 1 of the exemplary embodiment is configured by laminating, on the dielectric layer 104 (refer to FIG. 1B), the soft magnetic material layer 105a, the nonmagnetic amorphous metal layer 106a, the soft magnetic material layer 105b, the conductor layer 107, the soft magnetic material layer 105c, the nonmagnetic amorphous metal layer 106b, and the soft magnetic material layer 105d in this order.

In the magnetic sensor 1 in the exemplary embodiment, not the magnetization M, but the magnetic permeability μ changes in response to the amount of changes ΔH of the magnetic field H. The change in the magnetic permeability μ changes the skin depth ($\delta = \sqrt{2\rho/\omega\mu}$), and as a result, the impedance Z changes.

Hereinafter, the magnetic domain structure of the sensitive element 31 to which the exemplary embodiment is applied will be described in relation to the thickness of the nonmagnetic amorphous metal layer 106.

FIGS. 6A to 6D are photographs of the states of the magnetic domain of the sensitive element 31 to which the exemplary embodiment including the structure shown in FIGS. 2A and 2B is applied.

As shown in FIG. 2A, the sensitive element 31 is configured by laminating the soft magnetic material layer 105a, the nonmagnetic amorphous metal layer 106a, the soft magnetic material layer 105b, the conductor layer 107, the soft magnetic material layer 105c, the nonmagnetic amorphous metal layer 106b, and the soft magnetic material layer 105d in this order. The soft magnetic material layer 105 (the soft magnetic material layers 105a, 105b, 105c, and 105d) is $Co_{80}Nb_{17}Zr_3$ (figure indicates atomic %) with a thickness of 250 nm. The nonmagnetic amorphous metal layers 106a and 106b are composed of CrTi (the atomic % are both 50%). The conductive layer 107 is Ag with a thickness of 300 nm.

However, FIG. 6A shows a case not including the nonmagnetic amorphous metal layers 106a and 106b (denoted as CrTi=0 nm), and a soft magnetic material layer composed of $Co_{80}Nb_{17}Zr_3$ with the thickness of 500 nm, in which the soft magnetic material layers 105a and 105b are integrated, and a soft magnetic material layer composed of $Co_{80}Nb_{17}Zr_3$ with the thickness of 500 nm, in which the soft magnetic material layers 105c and 105d are integrated, are laminated with the conductor layer of Ag interposed therebetween.

FIG. 6B shows a case in which the thickness of the nonmagnetic amorphous metal layers 106a and 106b of CrTi is 15 nm (denoted as CrTi=15 nm), FIG. 6C shows a case in which the thickness of the nonmagnetic amorphous metal layers 106a and 106b of CrTi is 30 nm (denoted as CrTi=30 nm), and FIG. 6D shows a case in which the thickness of the nonmagnetic amorphous metal layers 106a and 106b of CrTi is 50 nm (denoted as CrTi=50 nm). Note that FIGS. 6A to 6D were photographed by use of Neomagnesia Lite manufactured by NEOARK CORPORATION in the state where no external magnetic field was applied (0 Oe).

As shown in FIG. 6A, in the case where the nonmagnetic amorphous metal layers 106a and 106b were not included (CrTi=0 nm), plural magnetic domains arranged in the longitudinal direction of the sensitive element 31 were observed. The state is similar to the magnetic domain structure shown in FIG. 4A.

In contrast thereto, as shown in FIGS. 6B to 6D, in the case where the nonmagnetic amorphous metal layers 106a and 106b of CrTi have a thickness of 15 nm or more, no magnetic domains (no closure magnetic domains) were not observed in the sensitive element 31. In other words, in the case where $Co_{80}Nb_{17}Zr_3$ serves as the soft magnetic material layer 105 and the nonmagnetic amorphous metal layer 106 is CrTi, the magnetic domain is not observed as long as the thickness of the nonmagnetic amorphous metal layer 106 of CrTi is not less than 15 nm. In short, the CrTi nonmagnetic amorphous metal layer 106 functions as a layer for suppressing occurrence of the magnetic domains in the soft magnetic material layer 105.

FIGS. 6B to 6D show the case in which CrTi was used as the nonmagnetic amorphous metal layer 106, which was the layer suppressing occurrence of the magnetic domains; however, as the nonmagnetic amorphous metal layer 106, AlTi, CrB, CrTa, CoW, or the like may be used.

Note that the use of a nonmagnetic material layer composed of Ru or $SiO_2$ instead of the nonmagnetic amorphous metal layer 106 suppresses the occurrence of the magnetic domains in some cases.

Consequently, the layer capable of suppressing the occurrence of these magnetic domains is referred to as a magnetic domain suppression layer.

Figure 7:
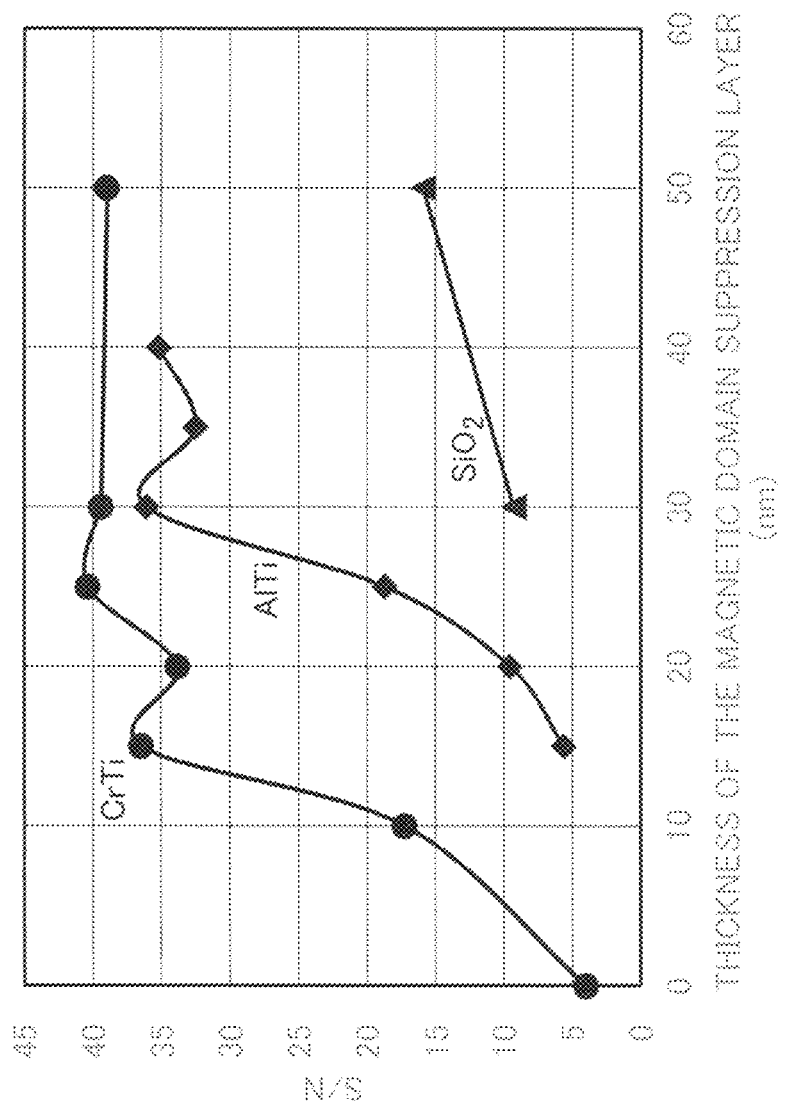
FIG. 7 shows the S/N of the sensitive element.

FIG. 7 shows the S/N of the sensitive element 31. Here, as the magnetic domain suppression layer, the case using CrTi and AlTi, which are the nonmagnetic amorphous metal layer 106 (denoted as CrTi and AlTi, respectively, in the figure), and the case using $SiO_2$, which is the nonmagnetic material layer (denoted as $SiO_2$ in the figure), are shown. In FIG. 7, the horizontal axis indicates the thickness of the magnetic domain suppression layer (nm), and the vertical axis indicates the S/N. Note that the thickness 0 of the magnetic domain suppression layer indicates the case in which the magnetic domain suppression layer is not used.

The S/N was evaluated using an AM modulated bridge circuit from the signal and noise of the magnetic sensor 1. The specific evaluation method is to place the magnetic sensor 1 in the AM modulated bridge circuit, input a sine wave signal magnetic field of 1 Hz from a solenoid coil into the magnetic sensor 1, use the output from the AM modulated bridge circuit, which is generated by the signal magnetic field, as "Signal," and use the output when the signal magnetic field is not inputted as "Noise." Then, the fast Fourier transform (FFT) was performed, and the ratio of Signal to Noise at 1 Hz was determined as the S/N.

In FIG. 7, the configuration of the sensitive element 31, in which the nonmagnetic amorphous metal layer 106 composed of CrTi is used as the magnetic domain suppression layer (CrTi in the figure), is the same as that of the sensitive element 31 shown in FIG. 6. In the sensitive element 31 using the nonmagnetic amorphous metal layer 106 composed of AlTi as the magnetic domain suppression layer (AlTi in the figure), the atomic % of Al and Ti is both 50%, and the thickness of each layer of the sensitive element 31 is the same as that of the sensitive element 31 using CrTi. In addition, the thickness of each layer in the configuration of the sensitive element 31 in the case where the magnetic domain suppression layer is composed of $SiO_2$ ($SiO_2$ in the figure), which is the nonmagnetic material layer, is the same as that of the sensitive element 31 using CrTi.

First, in FIG. 7, the case in which the nonmagnetic amorphous metal layer 106 composed of CrTi is used as the magnetic domain suppression layer (CrTi in the figure) will be described.

In the case where the thickness of CrTi is 0 nm, that is, there is no magnetic domain suppression layer, the S/N is 4.0. Use of CrTi as the magnetic domain suppression layer makes the S/N larger as compared to the case where the magnetic domain suppression layer is not provided. Then, as CrTi becomes thicker, the S/N is improved. In other words, the S/N when the thickness of CrTi is 10 nm is 17.2, which is four times that in the case of including no magnetic domain suppression layer. The S/N when the thickness of CrTi is 15 nm is 36.5, which is nine times that in the case of including no magnetic domain suppression layer. In addition, the S/N when the thickness of CrTi is 25 nm or more and 50 nm or less is 40, which is ten times as large as the case of including no magnetic domain suppression layer. In other words, it is learned that the S/N is improved by interposing CrTi, which is nonmagnetic amorphous metal, as the magnetic domain suppression layer between the soft magnetic material layers 105. In particular, in CrTi having the thickness of 15 nm or more and 50 nm or less, the S/N is substantially the same, and improvement in the S/N tends to saturate at the thickness of 15 nm.

As shown in FIGS. 6B to 6D, this is due to CrTi, which has the thickness of 15 nm or more, functioning as the magnetic domain suppression layer that suppresses the occurrence of the magnetic domains. In other words, it is considered that, by suppressing the occurrence of the magnetic domains, the noise caused in association with the discontinuous displacement of the magnetic domain walls constituting the closure magnetic domain, that is, the noise caused by the Barkhausen effect, is suppressed, and thereby reduction of the S/N obtained from the magnetic sensor 1 can be suppressed.

Note that, when the thickness of CrTi exceeds 50 nm, there is a possibility that the antiferromagnetic coupling energy of the soft magnetic material layers 105 facing each other with the nonmagnetic amorphous metal layer 106 of CrTi interposed therebetween is reduced. For this reason, it is preferable that CrTi has the thickness of 15 nm or more and 50 nm or less.

Next, in FIG. 7, the case in which the nonmagnetic amorphous metal layer 106 composed of AlTi is used as the magnetic domain suppression layer (AlTi in the figure) will be described.

In this case, as AlTi becomes thicker, the S/N is also increased. That is, the S/N when the thickness of AlTi is 15 nm is 5.6, which is 1.4 times that in the case of including no magnetic domain suppression layer (4.0 at the 0 nm thickness of CrTi). However the S/N when the thickness of AlTi is 30 nm is 36.1, which is nine times that in the case of including no magnetic domain suppression layer. The S/N when the thickness of AlTi is 35 nm is 32.5, and the S/N when the thickness of AlTi is 40 nm is 35.1. In other words, when the thickness of AlTi is 30 nm or more, the S/N is almost 35. The S/N is 8.8 times that in the case of including no magnetic domain suppression layer.

The tendency of the S/N improvement in AlTi is similar to that of CrTi; the S/N is improved as the thickness increases, but is saturated at a certain thickness. However, in AlTi, the thickness reaching saturation of the S/N (30 nm) is larger than that in CrTi (15 nm). In addition, the S/N (35) that reached saturation in AlTi is smaller than the S/N (40) that reached saturation in CrTi.

Next, in FIG. 7, the case in which the nonmagnetic material layer $SiO_2$ is used as the magnetic domain suppression layer denoted as $SiO_2$ in the figure will be described.

In this case, as $SiO_2$ becomes thicker, the S/N is also increased. That is, the S/N when the thickness of $SiO_2$ is 30 nm is 9.3, which is 2.3 times that in the case of including no magnetic domain suppression layer (4.0 at the 0 nm thickness of CrTi). The S/N when the thickness of $SiO_2$ is 50 nm is 15.9, which is 4.0 times that in the case of including no magnetic domain suppression layer. However, the S/N (15.9) is smaller than the S/N (40 or 35) that reached saturation in the case where CrTi or AlTi is used as the magnetic domain suppression layer.

As described above, even when the nonmagnetic material layer of $SiO_2$ is used as the magnetic domain suppression layer, improvement of the S/N can be observed. However, the use of nonmagnetic amorphous metal, such as CrTi or AlTi, as the magnetic domain suppression layer has a greater effect in improvement of the S/N than the use of the nonmagnetic material layer of $SiO_2$ as the magnetic domain suppression layer.

It is considered that the above-described improvement of the S/N is caused by interposing the nonmagnetic amorphous metal layer 106 of CrTi or AlTi, or the nonmagnetic material layer of $SiO_2$ between the soft magnetic material layers 105 to function as the magnetic domain suppression layer for suppressing occurrence of the magnetic domains, to thereby suppress occurrence of noise generated by the Barkhausen effect.

Figure 8:
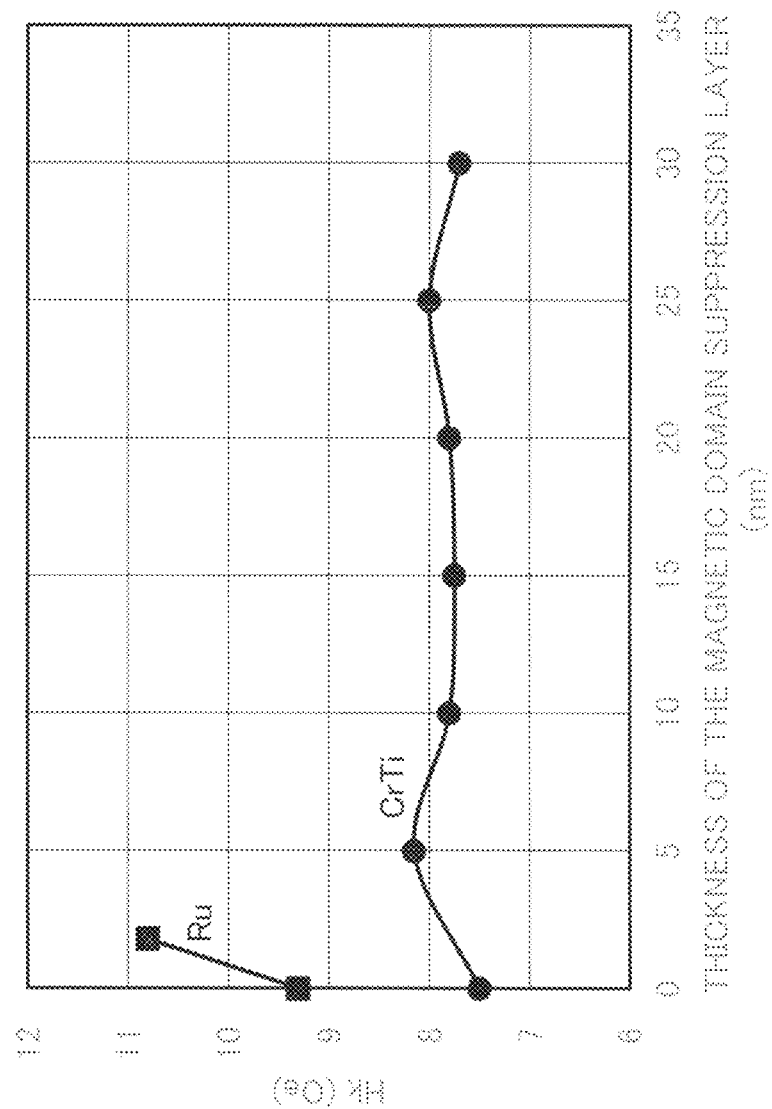
FIG. 8 shows the anisotropic magnetic field of the sensitive element.

FIG. 8 shows the anisotropic magnetic field Hk of the sensitive element 31. Here, as the magnetic domain suppression layer, the case using CrTi, which is the nonmagnetic amorphous metal layer 106 (denoted as CrTi in the figure), and the case using Ru, which is the nonmagnetic material layer (denoted as Ru in the figure), are shown. In FIG. 8, the horizontal axis indicates the thickness of the magnetic domain suppression layer (nm), and the vertical axis indicates the anisotropic magnetic field Hk (Oe). Note that the thickness 0 of the magnetic domain suppression layer indicates the case in which the magnetic domain suppression layer is not used.

In the magnetic sensor 1, as shown in FIG. 3, within the range in which the magnetic field H to be applied is smaller than the anisotropic magnetic field Hk of the sensitive element 31, a portion where the amount of changes ΔZ in the impedance Z with respect to the amount of changes ΔH in the magnetic field H is steep (ΔZ/ΔH is large) is used. Therefore, as the anisotropic magnetic field Hk is smaller, the changes in the impedance Z with respect to the amount of changes ΔH in the magnetic field H become steeper, and the bias magnetic field Hb to be applied may be smaller.

In FIG. 8, the case in which the nonmagnetic amorphous metal layer 106 composed of CrTi is used as the magnetic domain suppression layer (CrTi in the figure) will be described.

The sensitive element 31 has the same configuration as that described above.

In the case where the thickness of CrTi is 0 nm, that is, there is no magnetic domain suppression layer, the anisotropic magnetic field Hk is 7.5 Oe. The anisotropic magnetic field Hk, when CrTi with a thickness ranging from 5 nm to 30 nm is used as the magnetic domain suppression layer, is about 7.9. In this range, the anisotropic magnetic field Hk has a small difference due to the thickness. In other words, in the case where CrTi is used as the magnetic domain suppression layer, the anisotropic magnetic field Hk has little dependence on thickness. Moreover, the difference in the anisotropic magnetic field Hk between the case including no magnetic domain suppression layer and the case of using CrTi as the magnetic domain suppression layer is small. In other words, even though the nonmagnetic amorphous metal layer 106 composed of CrTi is used as the magnetic domain suppression layer, changes in the anisotropic magnetic field Hk are less likely to occur.

On the other hand, in FIG. 8, the case in which the nonmagnetic material layer composed of Ru is used as the magnetic domain suppression layer (Ru in the figure) will be described. Note that the nonmagnetic material layer composed of Ru is denoted as the nonmagnetic material layer (Ru).

The sensitive element 31 is configured by laminating the soft magnetic material layer, the nonmagnetic material layer (Ru), and the soft magnetic material layer in this order. The soft magnetic material layer is composed of $Co_{85}Nb_{12}Zr_3$ with a thickness of 500 nm, and the nonmagnetic material layer (Ru) is composed of Ru with a thickness of 1.8 nm. Note that a magnetic domain suppression layer of 0 nm means the case in which the nonmagnetic material layer (Ru) is not provided. In other words, in the case of the magnetic domain suppression layer of 0 nm, the sensitive element 31 is composed of a single layer of $Co_{85}Nb_{12}Zr_3$ with the thickness of 1000 nm.

In the case where no magnetic domain suppression layer is provided (0 nm), the anisotropic magnetic field Hk is 9.3 Oe. The anisotropic magnetic field Hk, when Ru with a thickness of 1.8 nm is used as the magnetic domain suppression layer, is about 10.8. In other words, if there is the magnetic domain suppression layer using the nonmagnetic material layer composed of Ru, the anisotropic magnetic field Hk is increased as compared to the case in which the magnetic domain suppression layer is not provided.

Moreover, even in the case where the sensitive element 31 was configured by laminating the soft magnetic material layer, the nonmagnetic material layer (Ru), the soft magnetic material layer, the nonmagnetic material layer (Ru), the soft magnetic material layer, the nonmagnetic material layer (Ru), and the soft magnetic material layer in this order, the anisotropic magnetic field Hk was 12.5 Oe. In this case, the soft magnetic material layer is composed of $Co_{85}Nb_{12}Zr_3$ with a thickness of 250 nm, and the nonmagnetic material layer (Ru) has a thickness of 1.8 nm. In other words, even if the thickness of the soft magnetic material layer is set to ½, and the number of nonmagnetic material layers (Ru) that function as the magnetic domain suppression layers is increased, the anisotropic magnetic field Hk is increased as compared to the case where the magnetic domain suppression layer is not provided.

Note that, in FIG. 8, the reason why the difference in the anisotropic magnetic field Hk in the case of not including the magnetic domain suppression layer (thickness is 0 nm) is caused between the case of CrTi and the case of Ru is due to the difference in the composition of the soft magnetic material layer 105. It is considered that, even though the composition of the soft magnetic material layer 105 differs, the tendency given to the anisotropic magnetic field Hk in the case where CrTi is used and the case where Ru is used as the magnetic domain suppression layer is similar to the above-described results.

As described above, the use of Ru as the magnetic domain suppression layer increases the anisotropic magnetic field Hk from the case where the magnetic domain suppression layer is not used. On the other hand, in the case where CrTi is used as the magnetic domain suppression layer, the anisotropic magnetic field Hk is about the same degree as that of the case where the magnetic domain suppression layer is not used, and there is little dependence on thickness.

The same is true in the case where AlTi, which is, similar to CrTi, the nonmagnetic amorphous metal, is used as the magnetic domain suppression layer.

(Method of Manufacturing Magnetic Sensor 1)

Next, an example of a method of manufacturing the magnetic sensor 1 will be described.

As described above, the substrate 10 is composed of a nonmagnetic material; examples thereof include an oxide substrate, such as glass or sapphire, a semiconductor substrate, such as silicon, or a metal substrate, such as aluminum, stainless steel, or a nickel-phosphorus-plated metal. On the substrate 10, for example, streaky grooves or streaky asperities with the radius of curvature Ra of 0.1 nm to 100 nm may be provided by use of a polisher or the like. Note that it is preferable to provide the streaks of the streaky grooves or the streaky asperities in a direction connecting the north pole and the south pole of the thin film magnet 20 configured with the hard magnetic material layer 103. By doing so, the crystal growth in the hard magnetic material layer 103 is promoted in the direction of the grooves. Consequently, the axis of easy magnetization of the thin film magnet 20 configured with the hard magnetic material layer 103 is more likely to face the groove direction (the direction connecting the north pole and the south pole of the thin film magnet 20). In other words, magnetization of the thin film magnet 20 is made easier.

Here, as an example, the substrate 10 will be described as glass having a diameter of about 95 mm and a thickness of about 0.5 mm. In the case where the planar shape of the magnetic sensor 1 is several millimeters square, plural magnetic sensors 1 are collectively manufactured on the substrate 10, and thereafter, divided (cut) into individual magnetic sensors 1.

After washing the substrate 10, on one of the surfaces (hereinafter, referred to as a front surface) of the substrate 10, the adhesive layer 101, the control layer 102, the hard magnetic material layer 103 and the dielectric layer 104 are deposited (accumulated) in order.

First, the adhesive layer 101 that is an alloy containing Cr or Ni, the control layer 102 that is an alloy containing Cr and the like, the hard magnetic material layer 103 that is a Co alloy constituting the thin film magnet 20 are continuously deposited (accumulated) in order. The deposition can be performed by a sputtering method or the like. The substrate 10 is moved to face plural targets formed of respective materials in order, and thereby the adhesive layer 101, the control layer 102 and the hard magnetic material layer 103 are laminated on the substrate 10 in order. As described above, in forming the control layer 102 and the hard magnetic material layer 103, the substrate 10 may be heated to, for example, 100° C. to 600° C. for accelerating the crystal growth.

Note that, in deposition of the adhesive layer 101, the substrate 10 may be heated or may not be heated. To remove the moisture and so forth absorbed onto the surface of the substrate 10, the substrate 10 may be heated before the adhesive layer 101 is deposited.

Next, the dielectric layer 104, which is oxide, such as $SiO_2$, $Al_2O_3$, or $TiO_2$, or nitride, such as $Si_3N_4$ or AlN, is deposited (accumulated). Deposition of the dielectric layer 104 can be performed by a plasma CVD method, a reactive sputtering method or the like.

Then, a pattern by photoresist (a resist pattern), which has openings serving as portions where the sensitive elements 31 of the sensitive part 30, is formed by a publicly known photolithography technique.

Subsequently, the Co alloy composing the soft magnetic material layer 105a, the nonmagnetic amorphous metal layer 106a, the Co alloy composing the soft magnetic material layer 105b, the conductor layer 107, the Co alloy composing the soft magnetic material layer 105c, the nonmagnetic amorphous metal layer 106b, and the Co alloy composing the soft magnetic material layer 105d that constitute the sensitive elements 31 are deposited (accumulated) in order. The deposition of the soft magnetic material layer 105, the nonmagnetic amorphous metal layer 106, and the conductor layer 107 can be performed by using, for example, the sputtering method.

Thereafter, as well as removing the resist pattern, the soft magnetic material layer 105a, the nonmagnetic amorphous metal layer 106a, the soft magnetic material layer 105b, the conductor layer 107, the soft magnetic material layer 105c, the nonmagnetic amorphous metal layer 106b, and the soft magnetic material layer 105d on the resist pattern are removed (lifted off). Thus, the sensitive element 31 is formed.

Next, a resist pattern by photoresist, which has openings serving as portions where the yokes 40, is formed by a publicly known photolithography technique.

Then, the Co alloy composing the soft magnetic material layer 109 is deposited (accumulated).

Thereafter, the resist pattern is removed, and the soft magnetic material layer 109 on the resist pattern is also removed (lifted off). Thus, the yokes 40 constituted by the soft magnetic material layer 109 are formed.

Next, the connection parts 32 and the terminal parts 33 of the sensitive part 30 are formed. The connection part 32 and the terminal part 33 are formed by, for example, depositing the conductor layer 110 by the sputtering method or the vacuum deposition method by use of a metal mask.

Thereafter, the uniaxial magnetic anisotropy is imparted to the soft magnetic material layer 105 constituting the sensitive elements 31 in the width direction (the short direction) of the sensitive elements 31 of the sensitive part 30 (refer to FIG. 1A). The impartation of the uniaxial magnetic anisotropy to the soft magnetic material layer 105 can be performed by heat treatment at 400° C. in a rotating magnetic field of, for example, 3 kG (0.3 T) (heat treatment in the rotating magnetic field) and by heat treatment at 400° C. in a static magnetic field of 3 kG (0.3 T) (heat treatment in the static magnetic field) subsequent thereto. At this time, the soft magnetic material layer 109 constituting the yokes 40 is provided with the same uniaxial magnetic anisotropy. However, the yokes 40 just have to play a role of a magnetic circuit, and may not be provided with the uniaxial magnetic anisotropy.

Next, the hard magnetic material layer 103 constituting the thin film magnet 20 is magnetized. Magnetizing of the hard magnetic material layer 103 can be performed by, in the static magnetic field or in a pulsed magnetic field, continuously applying a magnetic field larger than a coercive force of the hard magnetic material layer 103 until magnetization of the hard magnetic material layer 103 becomes saturated.

Thereafter, the plural magnetic sensors 1 formed on the substrate 10 is divided (cut) into the individual magnetic sensors 1. In other words, as shown in the plan view of FIG. 1A, the substrate 10, the adhesive layer 101, the control layer 102, the hard magnetic material layer 103, the dielectric layer 104 and the soft magnetic material layer 109 are cut to have a quadrangular planar shape. Then, on the side surfaces of the hard magnetic material layer 103 that has been divided (cut), magnetic poles (the north pole and the south pole) of the thin film magnet 20 are exposed. Thus, the magnetized hard magnetic material layer 103 serves as the thin film magnet 20. The division (cutting) can be performed by a dicing method, a laser cutting method or the like.

Note that, before the process of dividing plural magnetic sensors 1 into the individual magnetic sensors 1, the adhesive layer 101, the control layer 102, the hard magnetic material layer 103, the dielectric layer 104 and the soft magnetic material layer 105 between the adjacent magnetic sensors 1 on the substrate 10 may be removed by etching so that the planar shape of the magnetic sensor 1 is quadrangular (the planar shape of the magnetic sensor 1 shown in FIG. 1A). Then, the exposed substrate 10 may be divided (cut).

Moreover, after the process of forming the adhesive layer 101, the control layer 102, the hard magnetic material layer 103, and the dielectric layer 104, the adhesive layer 101, the control layer 102, the hard magnetic material layer 103, and the dielectric layer 104 may be processed so that the planar shape of the magnetic sensor 1 is quadrangular (the planar shape of the magnetic sensor 1 shown in FIG. 1A).

Note that the processes in the manufacturing method described here are simplified as compared to these manufacturing methods.

Thus, the magnetic sensor 1 is manufactured. Note that impartation of the uniaxial magnetic anisotropy to the soft magnetic material layer 105 and/or magnetization of the thin film magnet 20 may be performed on the magnetic sensor 1 or plural magnetic sensors 1 after the process of dividing the magnetic sensor 1 into the individual magnetic sensors 1.

Note that, in the case where the control layer 102 is not provided, it becomes necessary to impart the magnetic anisotropy in a plane by causing the crystal growth by heating the hard magnetic material layer 103 to not less than 800° C. after the hard magnetic material layer 103 was deposited. However, in the case where the control layer 102 is provided as in the magnetic sensor 1 to which the exemplary embodiment is applied, since the crystal growth is accelerated by the control layer 102, the crystal growth caused by high temperature, such as not less than 800° C., is not required.

In addition, impartation of the uniaxial magnetic anisotropy to the sensitive element 31 may be performed in depositing the soft magnetic material layer 105 by using the magnetron sputtering method, instead of being performed in the above-described heat treatment in the rotating magnetic field and heat treatment in the static magnetic field. In the magnetron sputtering method, a magnetic field is formed by using magnets and electrons generated by discharge are enclosed on a surface of a target. This increases collision probability of electrons and gases to accelerate ionization of gases, to thereby improve deposition rate of a film. By the magnetic field formed by the magnets used in the magnetron sputtering method, the soft magnetic material layer 105 is deposited, and at the same time, the uniaxial magnetic anisotropy is imparted to the soft magnetic material layer 105. By doing so, it is possible to omit the process of imparting the uniaxial magnetic anisotropy in the heat treatment in the rotating magnetic field and the heat treatment in the static magnetic field.

Modified Example

Figure 9A:
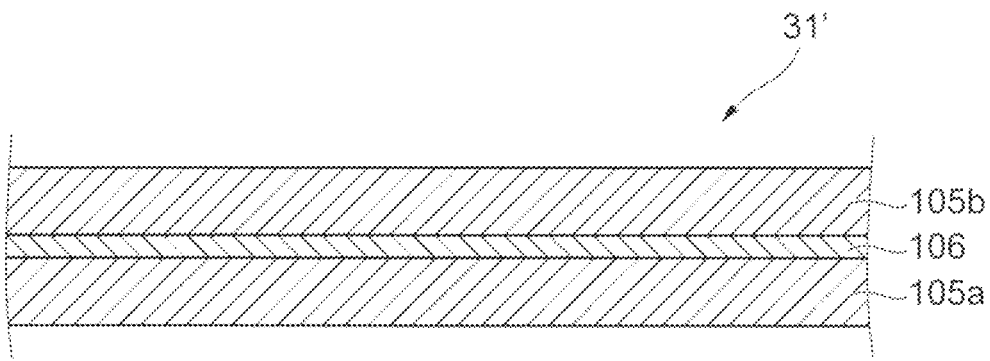
FIGS. 9A and 9B illustrate configurations of modified examples of each sensitive element of the sensitive part in the exemplary embodiment.
Figure 9B:
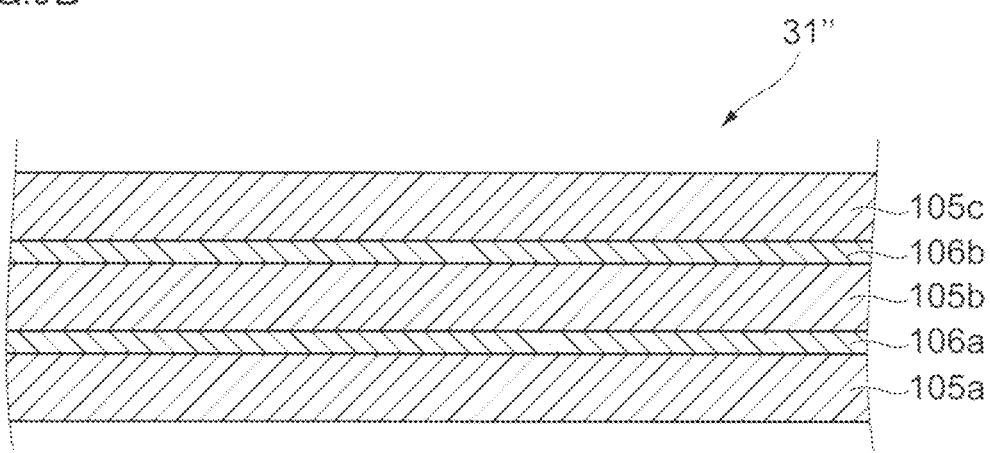

FIGS. 9A and 9B illustrate configurations of modified examples of each sensitive element 31 of the sensitive part 30 in the exemplary embodiment. In FIGS. 9A and 9B, the same reference sign is assigned to the components similar to those shown in FIG. 2A.

The sensitive element 31 shown in FIGS. 2A and 2B, to which the exemplary embodiment is applied, included the conductor layer 107. The conductor layer 107 is, as described above, provided to suppress reduction of the amount of changes ΔZ of the impedance Z to the amount of changes ΔH of the magnetic field H (ΔZ/ΔH) in the case where the high frequency current is supplied. Therefore, the conductor layer 107 is not needed to be provided if it is unnecessary to suppress the reduction of the amount of changes ΔZ of the impedance Z (ΔZ/ΔH).

FIG. 9A shows a configuration of a sensitive element 31', which is a first modified example. The sensitive element 31' is configured by laminating, from the dielectric layer 104 (refer to FIG. 1B) side, the soft magnetic material layer 105a, the nonmagnetic amorphous metal layer 106, and the soft magnetic material layer 105b in this order. In other words, the sensitive element 31' has a configuration in which the laminated body 108a is taken out of the sensitive element 31 shown in FIGS. 2A and 2B.

As the nonmagnetic amorphous metal layer 106, the nonmagnetic amorphous metal having the action of allowing the soft magnetic material layers 105 facing each other with the nonmagnetic amorphous metal layer 106 interposed therebetween to be antiferromagnetically coupled can be used, and specific examples of such nonmagnetic amorphous metal include CrTi, AlTi, CrB, CrTa, and CoW.

Even in the sensitive element 31', the occurrence of magnetic domains can be suppressed, and the S/N is improved.

FIG. 9B shows a configuration of a sensitive element 31" of a second modified example. The sensitive element 31" is configured by laminating, from the dielectric layer 104 (refer to FIG. 1B) side, the soft magnetic material layer 105a, the nonmagnetic amorphous metal layer 106a, the soft magnetic material layer 105b, the nonmagnetic amorphous metal layer 106b, and the soft magnetic material layer 105c in this order. In other words, the soft magnetic material layers 105 and the nonmagnetic amorphous metal layers 106 are alternately laminated so that the soft magnetic material layers 105 are placed closest to the dielectric layer 104 and farthest from the dielectric layer 104. Note that, the number of layers is not limited to that shown in FIG. 9B.

As the nonmagnetic amorphous metal layer 106, the nonmagnetic amorphous metal having the action of allowing the soft magnetic material layers 105 facing each other with the nonmagnetic amorphous metal layer 106 interposed therebetween to be antiferromagnetically coupled can be used, and specific examples of such nonmagnetic amorphous metal include CrTi, AlTi, CrB, CrTa, and CoW.

Even in the sensitive element 31", the occurrence of magnetic domains can be suppressed, and the S/N is improved.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A magnetic sensor comprising:
a sensitive element comprising:
plural soft magnetic material layers; and
a nonmagnetic amorphous metal layer provided between the plural soft magnetic material layers, wherein
the soft magnetic material layers facing each other with the nonmagnetic amorphous metal layer interposed therebetween are antiferromagnetically coupled to allow the sensitive element to sense a magnetic field by a magnetic impedance effect,
wherein the nonmagnetic amorphous metal layer is composed of amorphous metal containing Ti.

2. The magnetic sensor according to claim 1, wherein the sensitive element further comprises a conductor layer having conductivity higher than that of the soft magnetic material layer, the conductor layer being provided between a set of the plural soft magnetic material layers facing each other with the nonmagnetic amorphous metal layer interposed therebetween and another set of the plural soft magnetic material layers facing each other with the nonmagnetic amorphous metal layer interposed therebetween.

3. The magnetic sensor according to claim 1, wherein the nonmagnetic amorphous metal layer is composed of one of CrTi and AlTi.

4. The magnetic sensor according to claim 3, wherein, when the nonmagnetic amorphous metal layer is composed of CrTi, a thickness thereof is 15 nm or more and 50 nm or less.

5. The magnetic sensor according to claim 1, wherein, in the sensitive element, when the soft magnetic material layer is viewed from a thickness direction thereof, no closure magnetic domain is formed.

6. The magnetic sensor according to claim 1, further comprising:
a nonmagnetic substrate; and
a thin film magnet provided between the substrate and the sensitive element, the thin film magnet being configured with a hard magnetic material and having magnetic anisotropy in an in-plane direction, wherein
the sensitive element has a longitudinal direction and a short direction, the longitudinal direction taking a direction of a magnetic field generated by the thin film magnet.

7. The magnetic sensor according to claim 6, further comprising:

a pair of yokes, each being laminated on the thin film magnet to face an end portion of the sensitive element in the longitudinal direction thereof, and guiding a magnetic flux generated from the thin film magnet to pass through the sensitive element in the longitudinal direction thereof, wherein the yoke comprises the plural soft magnetic material layers and a nonmagnetic amorphous metal layer laminated between the soft magnetic material layers.

* * * * *